(12) United States Patent
Jung et al.

(10) Patent No.: US 8,586,434 B1
(45) Date of Patent: Nov. 19, 2013

(54) METHOD OF MANUFACTURING SEMICONDUCTOR DEVICE

(71) Applicant: Hyundai Motor Company, Seoul (KR)

(72) Inventors: Youngkyun Jung, Seoul (KR);
Kyoung-Kook Hong, Hwaseong-si (KR); Jong Seok Lee, Suwon-si (KR);
Dae Hwan Chun, Gwangmyung-si (KR)

(73) Assignee: Hyundai Motor Company, Seoul (KR)

( * ) Notice: Subject to any disclaimer, the term of this patent is extended or adjusted under 35 U.S.C. 154(b) by 0 days.

(21) Appl. No.: 13/729,534

(22) Filed: Dec. 28, 2012

(30) Foreign Application Priority Data

Nov. 1, 2012 (KR) .................. 10-2012-0123013

(51) Int. Cl.
*H01L 21/00* (2006.01)
(52) U.S. Cl.
USPC ........................... 438/268; 438/285; 438/931
(58) Field of Classification Search
USPC ................. 438/268–272, 285, 931
See application file for complete search history.

(56) References Cited

U.S. PATENT DOCUMENTS

| 5,322,802 A | * | 6/1994 | Baliga et al. | ............... 438/268 |
| 5,399,515 A | * | 3/1995 | Davis et al. | ............... 438/270 |
| 5,915,180 A | * | 6/1999 | Hara et al. | ............... 438/270 |

\* cited by examiner

*Primary Examiner* — Richard Booth
(74) *Attorney, Agent, or Firm* — Morgan, Lewis & Bockius LLP

(57) ABSTRACT

A method of manufacturing a semiconductor device may include forming a first n− type epitaxial layer by performing a first epitaxial growth on a first surface of an n+ type silicon carbide substrate, forming a photosensitive layer pattern on the first n− type epitaxial layer, etching the first n− type epitaxial layer by using the photosensitive layer pattern as a mask to form a first trench, forming a buffer layer on the first n− type epitaxial layer after the photosensitive layer pattern may be removed, etching the buffer layer to form a trench passivation layer in the first trench, forming an n− type epitaxial layer by performing a second epitaxial growth on the first n− type epitaxial layer, and forming a p type epitaxial layer by performing a third epitaxial growth on the n− type epitaxial layer other than the portion on which the trench passivation layer may be formed.

10 Claims, 10 Drawing Sheets

METHOD OF MANUFACTURING SEMICONDUCTOR DEVICE

CROSS-REFERENCE TO RELATED APPLICATION

The present application claims priority to Korean Patent Application No. 10-2012-0123013 filed on Nov. 1, 2012, the entire contents of which is incorporated herein for all purposes by this reference.

BACKGROUND OF THE INVENTION

1. Field of the Invention

The present invention relates to a method of manufacturing a semiconductor device including silicon carbide (SiC).

2. Description of Related Art

In accordance with the recent trend of enlarging size and capacity of application equipment, a demand for a semiconductor device for electric power, having a high breakdown voltage, a high current, and a high-speed switching characteristic has been raised.

Accordingly, many studies and developments of a MOSFET (metal oxide semiconductor field effect transistor) using silicon carbide (SiC) have been made instead of a known MOSFET using silicon. Particularly, many developments of a vertical type trench MOSFET have been made.

The MOSFET is the most general electric field effect transistor in a digital circuit and an analog circuit among semiconductor devices for electric power.

In the case of the vertical type trench MOSFET, an etching technology of forming a trench in a form suitable to a semiconductor substrate is required. Since silicon carbide has hardness and oxidation resistance that are higher than those of silicon due to a strong covalent bond material, high power etching is performed in order to overcome endurance for etching, thus causing a phenomenon where a corner portion of the trench is more deeply etched as compared to the bottom due to high power etching. Accordingly, an electric field concentration phenomenon occurs at the corner portion of the trench causing breakage of an oxidation layer, thus reducing performance of the semiconductor device.

The information disclosed in this Background of the Invention section is only for enhancement of understanding of the general background of the invention and should not be taken as an acknowledgement or any form of suggestion that this information forms the prior art already known to a person skilled in the art.

BRIEF SUMMARY

Various aspects of the present invention are directed to providing a method of preventing a corner portion of a trench from being overetched in a silicon carbide MOSFET to which a trench gate is applied.

In an aspect of the present invention, a method of manufacturing a semiconductor device, may include forming a first n− type epitaxial layer by performing a first epitaxial growth on a first surface of an n+ type silicon carbide substrate, forming a photosensitive layer pattern on the first n− type epitaxial layer, etching the first n− type epitaxial layer by using the photosensitive layer pattern as a mask to form a first trench to form a trench, forming a buffer layer on the first n− type epitaxial layer after the photosensitive layer pattern is removed, etching the buffer layer to form a trench passivation layer in the first trench, forming an n− type epitaxial layer by performing a second epitaxial growth on the first n− type epitaxial layer other than a portion on which the trench passivation layer is formed, and forming a p type epitaxial layer by performing a third epitaxial growth on the n− type epitaxial layer other than the portion on which the trench passivation layer is formed, wherein the forming of the n− type epitaxial layer may include forming a first trench extension portion consecutively extending from the first trench to form the trench, and wherein the forming of the p type epitaxial layer may include forming a second trench extension portion consecutively extending from the first trench extension portion to form the trench.

The method of manufacturing the semiconductor device may further include after the forming of the p type epitaxial layer, forming an n+ region by performing a fourth epitaxial growth on the p type epitaxial layer.

The forming of the n+ region may include forming a third trench extension portion consecutively extending from the second trench extension portion.

The trench may further include the third trench extension portion.

The lengths of the first trench extension portion, the second trench extension portion, and the third trench extension portion are each controlled.

The method of manufacturing the semiconductor device may further include after the forming of the n+ region, forming a gate insulating layer in the trench after the trench passivation layer is removed, forming a gate electrode on the gate insulating layer, forming an oxidation layer on the gate insulating layer and the gate electrode, and forming a source electrode on the p type epitaxial layer, the n+ region, and the oxidation layer, and forming a drain electrode on a second surface of the n+ type silicon carbide substrate.

A depth of a bottom of the first trench and a depth of a corner portion of the first trench are the same as each other.

The lengths of the first trench extension portion and the second trench extension portion are each controlled.

The buffer layer is formed of amorphous carbon.

A depth of a bottom of the first trench and the depth of a corner portion of the first trench are the same as each other.

As described above, according to the exemplary embodiments of the present invention, it is possible to form a trench where a corner portion is not overetched by forming a first trench so that a corner portion is not overetched, and then forming a trench extension portion consecutively extending from the first trench by an epitaxial growth.

Further, it is possible to prevent a reduction in performance of a semiconductor device by preventing an electric field concentration phenomenon at the corner portion of the trench.

The methods and apparatuses of the present invention have other features and advantages which will be apparent from or are set forth in more detail in the accompanying drawings, which are incorporated herein, and the following Detailed Description, which together serve to explain certain principles of the present invention.

Figure 1:
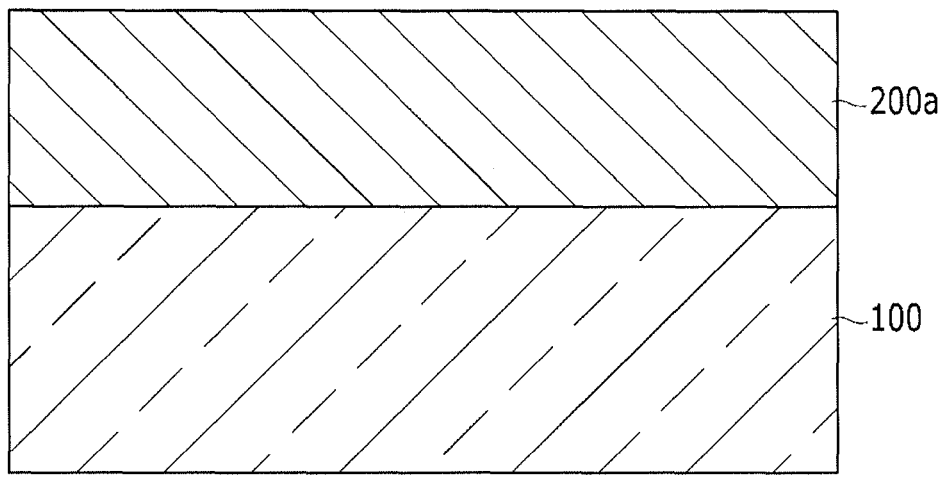
FIGS. 1 to 10 are views sequentially illustrating a method of manufacturing a semiconductor device according to an exemplary embodiment of the present invention.

It should be understood that the appended drawings are not necessarily to scale, presenting a somewhat simplified representation of various features illustrative of the basic principles of the invention. The specific design features of the present invention as disclosed herein, including, for example, specific dimensions, orientations, locations, and shapes will be determined in part by the particular intended application and use environment.

In the figures, reference numbers refer to the same or equivalent parts of the present invention throughout the several figures of the drawing.

DETAILED DESCRIPTION

Reference will now be made in detail to various embodiments of the present invention(s), examples of which are illustrated in the accompanying drawings and described below. While the invention(s) will be described in conjunction with exemplary embodiments, it will be understood that the present description is not intended to limit the invention(s) to those exemplary embodiments. On the contrary, the invention(s) is/are intended to cover not only the exemplary embodiments, but also various alternatives, modifications, equivalents and other embodiments, which may be included within the spirit and scope of the invention as defined by the appended claims.

Hereinafter, exemplary embodiments of the present invention will be described in detail with reference to the accompanying drawings. As those skilled in the art would realize, the described embodiments may be modified in various different ways, all without departing from the spirit or scope of the present invention. On the contrary, exemplary embodiments introduced herein are provided to make disclosed contents thorough and complete and sufficiently transfer the spirit of the present invention to those skilled in the art.

In the drawings, the thickness of layers, films, panels, regions, etc., are exaggerated for clarity. Further, it will be understood that when a layer is referred to as being "on" another layer or substrate, it can be directly on the other layer or substrate, or intervening them may also be present. Like reference numerals designate like elements throughout the specification.

Hereinafter, referring to FIGS. 1 to 10, a method of manufacturing a semiconductor device according to an exemplary embodiment of the present invention will be described in detail.

FIGS. 1 to 10 are views sequentially illustrating a method of manufacturing a semiconductor device according to an exemplary embodiment of the present invention.

As illustrated in FIG. 1, an n+ type silicon carbide substrate 100 is prepared, and a first n− type epitaxial layer 200a is formed on a first surface of the n+ type silicon carbide substrate 100 by a first epitaxial growth.

Figure 2:
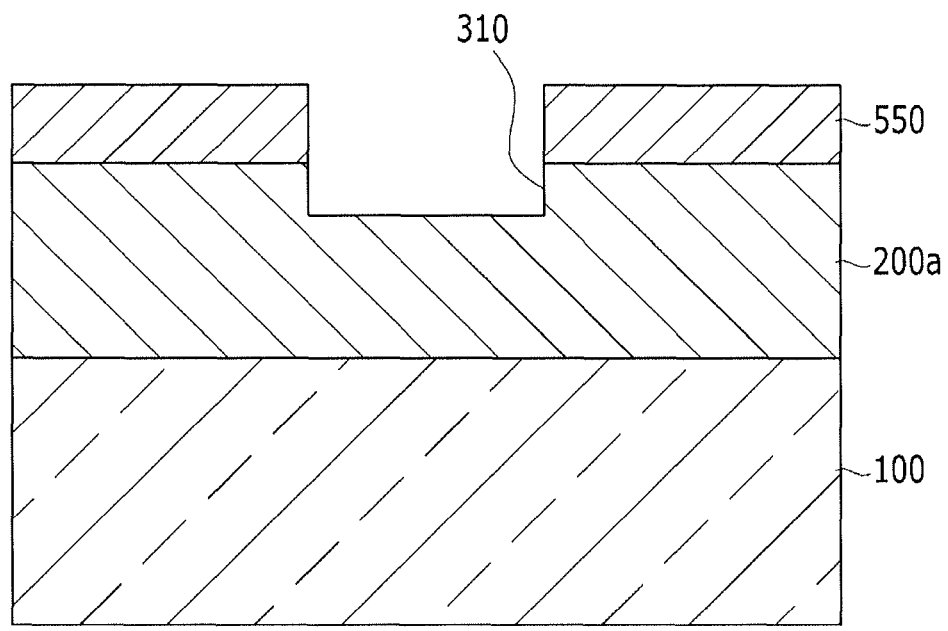

As illustrated in FIG. 2, after a photosensitive layer pattern 550 is formed on the first n− type epitaxial layer 200a, the exposed first n− type epitaxial layer 200a is etched by using the photosensitive layer pattern 550 as a mask to form a first trench 310. In this case, the etching is performed only to a depth at which the corner portion of the first trench 310 is not overetched. That is, the depth of the bottom of the first trench 310 and the depth of the corner portion of the first trench 310 are the same as each other.

Figure 3:
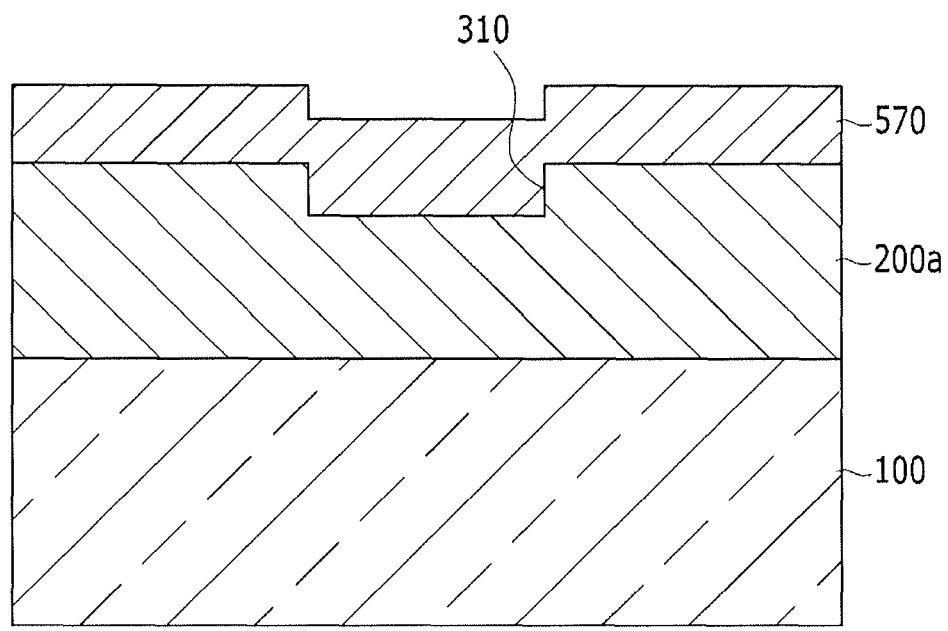
Figure 4:
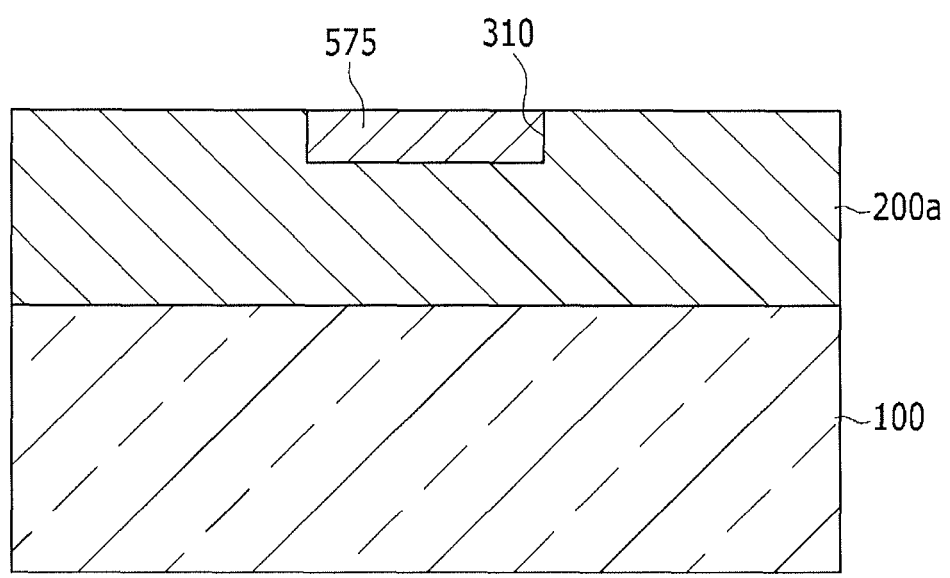

As illustrated in FIGS. 3 and 4, after the photosensitive layer pattern 550 is removed, a buffer layer 570 is formed on the first n− type epitaxial layer 200a, and then the buffer layer 570 is etched so that a trench passivation layer 575 is formed in the first trench 310. The buffer layer 570 is formed of amorphous carbon, which is to prevent occurrence of impurity at an interface between silicon carbide, the buffer layer 570, and the trench passivation layer 575.

Figure 5:
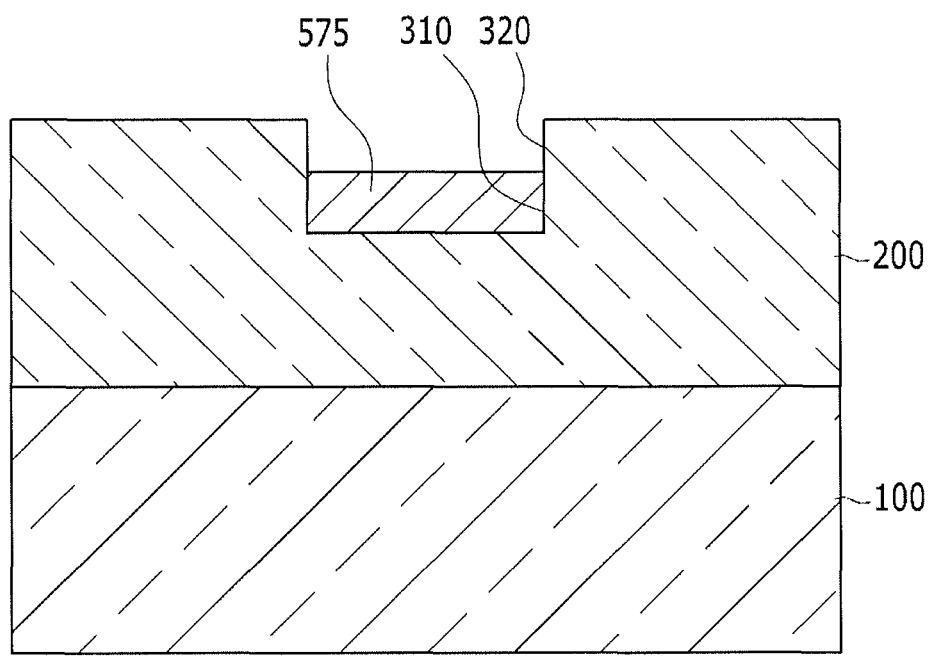

As illustrated in FIG. 5, a second epitaxial growth is performed on the first n− type epitaxial layer 200a other than a portion on which the trench passivation layer 575 is formed to form an n− type epitaxial layer 200. In this case, a first trench extension portion 320 consecutively extending from the first trench 310 is formed. The length of the first trench extension portion 320 is the same as a thickness of the epitaxially grown first n− type epitaxial layer 200a.

Figure 6:
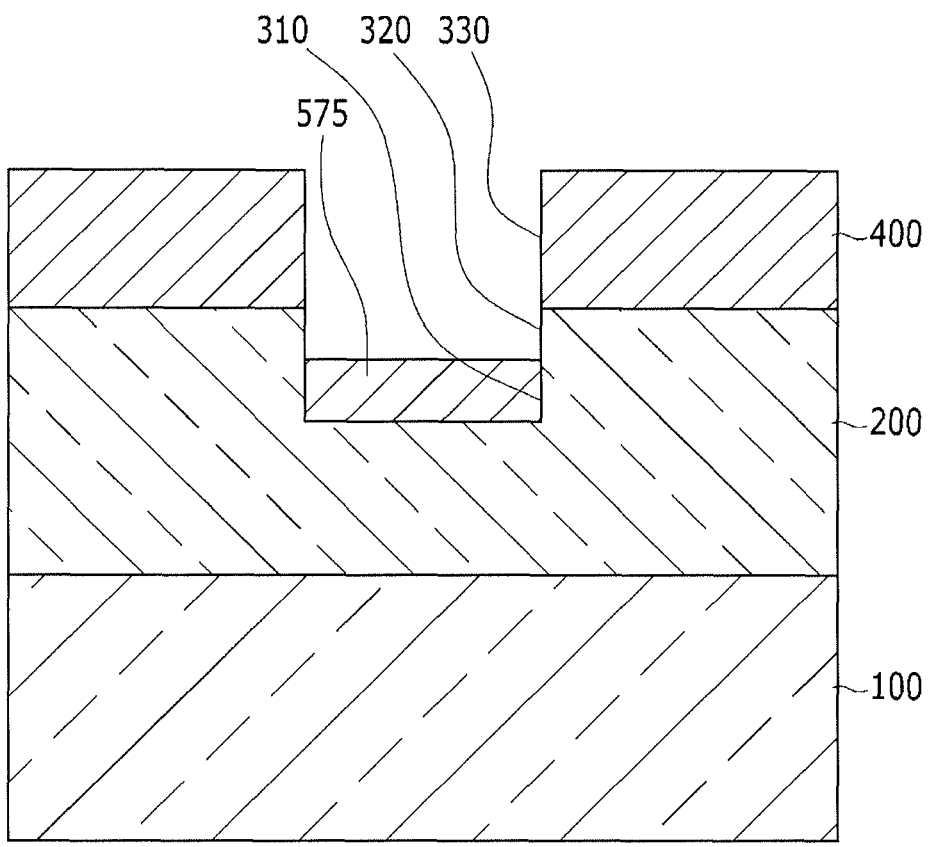

As illustrated in FIG. 6, a third epitaxial growth is performed on the n− type epitaxial layer 200 other than the portion on which the trench passivation layer 575 is formed to form the p− type epitaxial layer 400. In this case, a second trench extension portion 330 consecutively extending from the first trench extension portion 320 is formed. The length of the second trench extension portion 330 is the same as a thickness of the epitaxially grown p type epitaxial layer 400.

Figure 7:
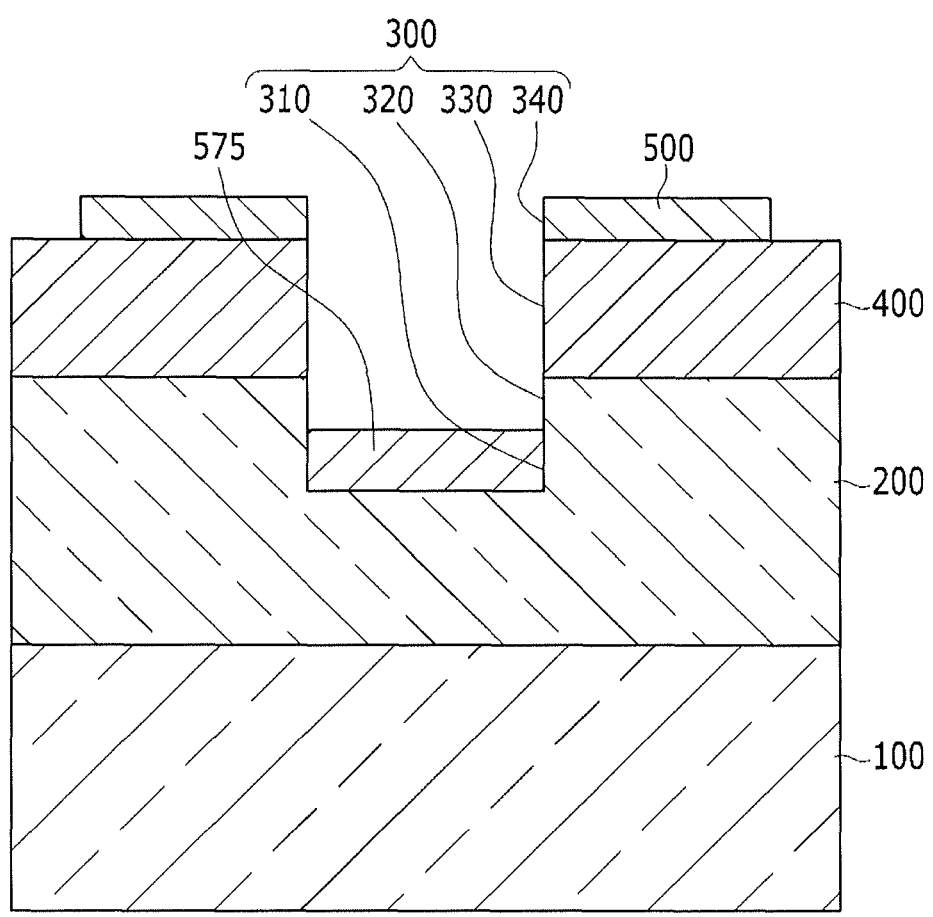

As illustrated in FIG. 7, a fourth epitaxial growth is performed on the p type epitaxial layer 400, and a portion thereof is etched to form an n+ region 500. In this case, a third trench extension portion 340 consecutively extending from the second trench extension portion 330 is formed to form a trench 300. The length of the third trench extension portion 340 is the same as a thickness of the epitaxially grown n+ region 500.

That is, the trench 300 includes the first trench 310, the first trench extension portion 320, the second trench extension portion 330, and the third trench extension portion 340. Herein, the lengths of the first trench extension portion 320, the second trench extension portion 330, and the third trench extension portion 340 may be each controlled.

In the exemplary embodiment, the n+ region 500 is formed by performing the fourth epitaxial growth and then performing partial etching, but the n+ region 500 may be formed by injecting n+ ions into a portion of a surface of the p type epitaxial layer 400 without performing the epitaxial growth. In this case, the trench 300 includes the first trench 310, the first trench extension portion 320, and the second trench extension portion 330.

Figure 8:
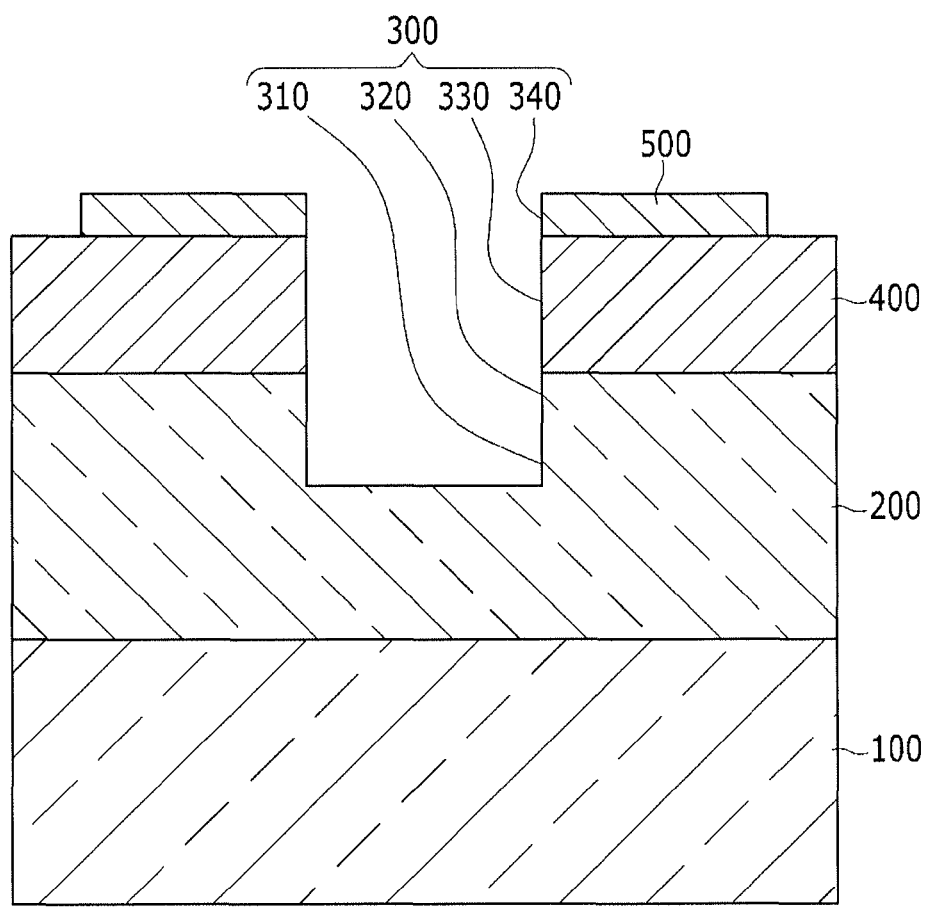
Figure 9:
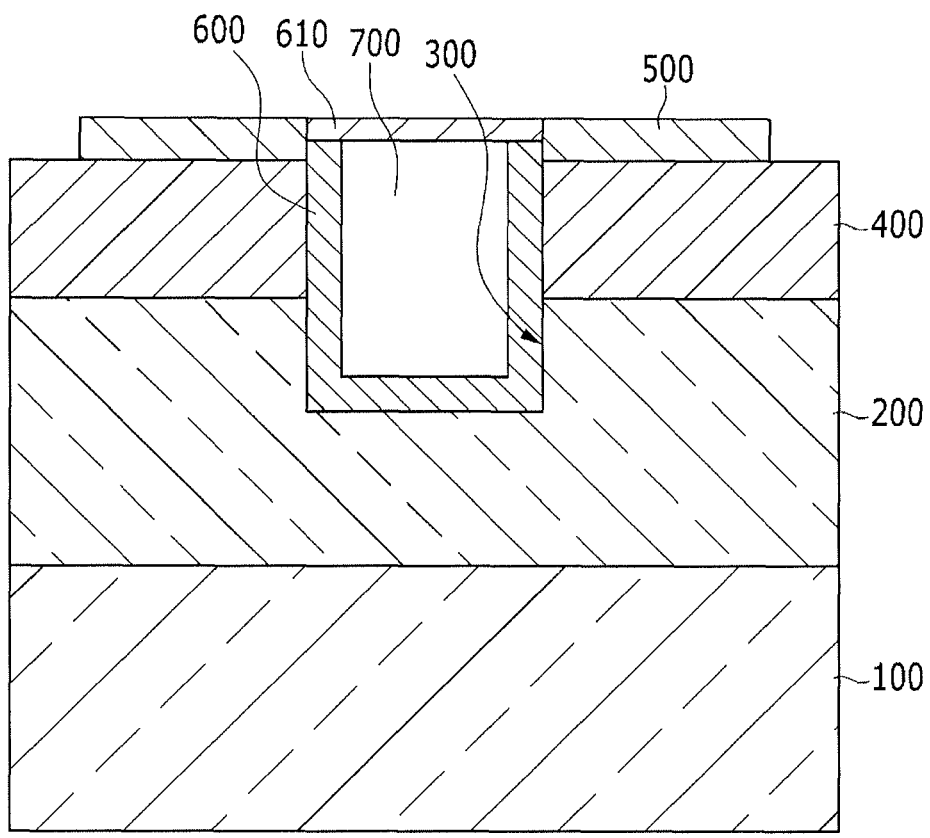

As illustrated in FIGS. 8 and 9, after the trench passivation layer 575 is removed, a gate insulating layer 600 is formed in the trench 300, a gate electrode 700 is formed on the gate insulating layer 600, and an oxidation layer 610 is formed on the gate insulating layer 600 and the gate electrode 700.

Figure 10:
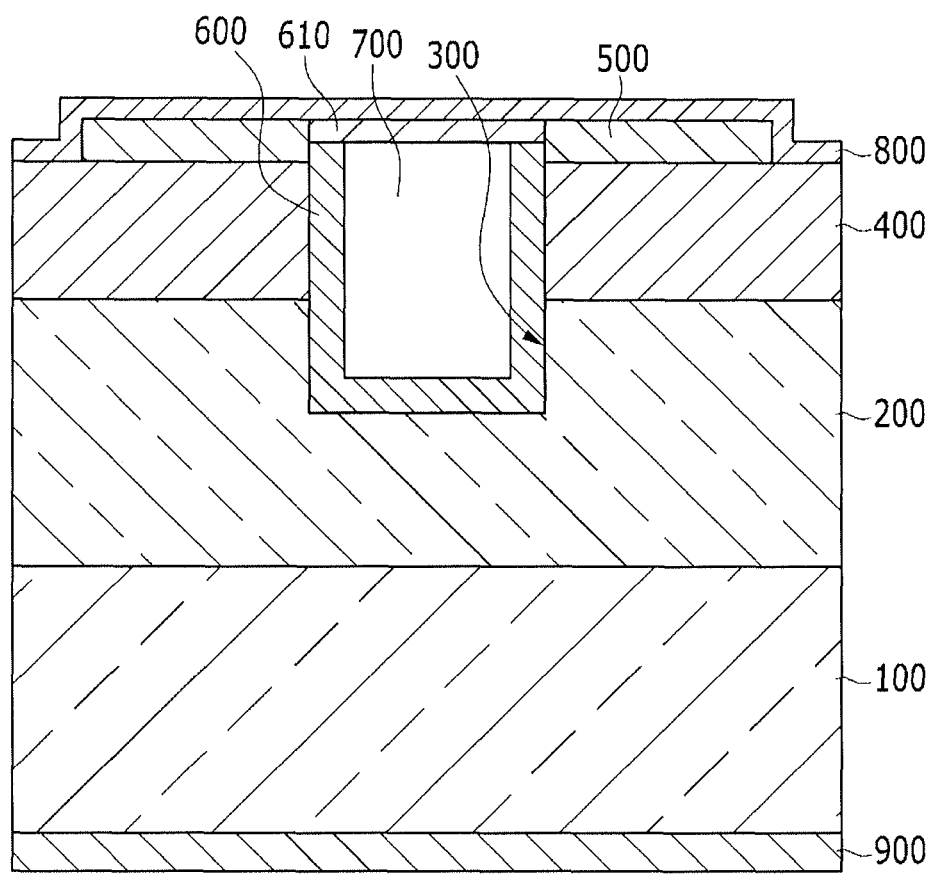

As illustrated in FIG. 10, a source electrode 800 is formed on the p type epitaxial layer 400, the n+ region 500, and the oxidation layer 610, and a drain electrode 900 is formed on a second surface of the n+ type silicon carbide substrate 100.

As described above, it is possible to form the trench 300 where the corner portion is not overetched by forming the first trench 310 so that the corner portion is not overetched, and then forming the first trench extension portion 320, the second trench extension portion 330, and the third trench extension portion 340 consecutively extending from the first trench 310 by epitaxial growth. Accordingly, it is possible to prevent a reduction in performance of the semiconductor device by preventing an electric field concentration phenomenon at the corner portion of the trench 300.

For convenience in explanation and accurate definition in the appended claims, the terms "upper", "lower", "inner" and "outer" are used to describe features of the exemplary embodiments with reference to the positions of such features as displayed in the figures.

The foregoing descriptions of specific exemplary embodiments of the present invention have been presented for purposes of illustration and description. They are not intended to be exhaustive or to limit the invention to the precise forms disclosed, and obviously many modifications and variations are possible in light of the above teachings. The exemplary embodiments were chosen and described in order to explain certain principles of the invention and their practical application, to thereby enable others skilled in the art to make and utilize various exemplary embodiments of the present invention, as well as various alternatives and modifications thereof. It is intended that the scope of the invention be defined by the Claims appended hereto and their equivalents.

What is claimed is:

1. A method of manufacturing a semiconductor device, comprising:
   forming a first n– type epitaxial layer by performing a first epitaxial growth on a first surface of an n+ type silicon carbide substrate;
   forming a photosensitive layer pattern on the first n– type epitaxial layer;
   etching the first n– type epitaxial layer by using the photosensitive layer pattern as a mask to form a first trench to form a trench;
   forming a buffer layer on the first n– type epitaxial layer after the photosensitive layer pattern is removed;
   etching the buffer layer to form a trench passivation layer in the first trench;
   forming an n– type epitaxial layer by performing a second epitaxial growth on the first n– type epitaxial layer other than a portion on which the trench passivation layer is formed; and
   forming a p type epitaxial layer by performing a third epitaxial growth on the n-type epitaxial layer other than the portion on which the trench passivation layer is formed;
   wherein the forming of the n– type epitaxial layer includes forming a first trench extension portion consecutively extending from the first trench to form the trench; and
   wherein the forming of the p type epitaxial layer includes forming a second trench extension portion consecutively extending from the first trench extension portion to form the trench.

2. The method of manufacturing the semiconductor device of claim 1, further including after the forming of the p type epitaxial layer, forming an n+ region by performing a fourth epitaxial growth on the p type epitaxial layer.

3. The method of manufacturing the semiconductor device of claim 2, wherein the forming of the n+ region includes forming a third trench extension portion consecutively extending from the second trench extension portion.

4. The method of manufacturing the semiconductor device of claim 3, wherein the trench further includes the third trench extension portion.

5. The method of manufacturing the semiconductor device of claim 4, wherein the lengths of the first trench extension portion, the second trench extension portion, and the third trench extension portion are each controlled.

6. The method of manufacturing the semiconductor device of claim 5, further including:
   after the forming of the n+ region,
   forming a gate insulating layer in the trench after the trench passivation layer is removed,
   forming a gate electrode on the gate insulating layer,
   forming an oxidation layer on the gate insulating layer and the gate electrode, and
   forming a source electrode on the p type epitaxial layer, the n+ region, and the oxidation layer, and forming a drain electrode on a second surface of the n+ type silicon carbide substrate.

7. The method of manufacturing the semiconductor device of claim 6, wherein a depth of a bottom of the first trench and a depth of a corner portion of the first trench are the same as each other.

8. The method of manufacturing the semiconductor device of claim 1, wherein the lengths of the first trench extension portion and the second trench extension portion are each controlled.

9. The method of manufacturing the semiconductor device of claim 1, wherein the buffer layer is formed of amorphous carbon.

10. The method of manufacturing the semiconductor device of claim 1, wherein a depth of a bottom of the first trench and the depth of a corner portion of the first trench are the same as each other.

* * * * *